United States Patent [19]
Farrall

[11] Patent Number: 4,595,855
[45] Date of Patent: Jun. 17, 1986

[54] SYNCHRONOUSLY OPERABLE ELECTRICAL CURRENT SWITCHING APPARATUS

[75] Inventor: George A. Farrall, Rexford, N.Y.

[73] Assignee: General Electric Company, Schenectady, N.Y.

[21] Appl. No.: 684,881

[22] Filed: Dec. 21, 1984

[51] Int. Cl.[4] .............................................. H01L 41/08
[52] U.S. Cl. .................................... 310/332; 310/330; 310/316; 310/317; 200/181
[58] Field of Search ................................ 310/330–331, 310/317, 319, 316; 200/181

[56] References Cited

U.S. PATENT DOCUMENTS

| | | | |
|---|---|---|---|
| 2,166,763 | 7/1939 | Mason | 175/320 |
| 2,182,340 | 12/1939 | Hearn | 178/71 |
| 2,471,967 | 5/1949 | Mason | 171/327 |
| 2,835,761 | 5/1958 | Crownover | 200/87 |
| 3,292,111 | 12/1966 | Cotton | 335/3 |
| 3,381,226 | 4/1968 | Jones et al. | 328/3 |
| 3,486,042 | 12/1969 | Watrous | 307/252 |
| 3,688,135 | 8/1972 | Koda et al. | 310/8.5 |
| 4,074,333 | 2/1978 | Murakami et al. | 361/13 |
| 4,093,883 | 6/1978 | Yamamoto | 310/317 |
| 4,403,166 | 9/1983 | Tanaka et al. | 310/332 |

FOREIGN PATENT DOCUMENTS

| | | | |
|---|---|---|---|
| 273157 | 7/1964 | Australia | 310/330 |

*Primary Examiner*—Mark O. Budd

*Attorney, Agent, or Firm*—Jeffrey L. Brandt; James C. Davis, Jr.; Paul R. Webb, II

[57] ABSTRACT

A synchronously operable electrical current switching apparatus includes a controllable piezoelectric relay having movable electrical contacts, and means for controlling the relay so as to move the contacts and effect a change of state of the electrical connectivity between them. The apparatus also includes means for operating the controlling mechanism so as to substantially reduce arcing between the contacts. A relay which is especially useful in the apparatus utilizes a piezoelectric bender and a flexible member disposed adjacent to one of the flat surfaces of the bender. The flexible member is fixed to the bender so that bending motion of the bender causes corresponding movement of the flexible member. At least one first electrical contact is disposed on the flexible member, and an electrical conductor having at least one second electrical contact is disposed adjacent the flexible member on the side thereof opposite the side which is adjacent to the bender. The electrical conductor is fixed to the flexible member so that movement of the member causes a change in electrical connectivity between the first and second contacts, and so that the electrical conductor is electrically isolated from the first contact when the first and second contacts are in an open position. The relay may be enclosed in a conventional 16 pin dual-in-line integrated circuit package, and is particularly useful for switching circuits operating at household power line current levels.

25 Claims, 5 Drawing Figures

SYNCHRONOUSLY OPERABLE ELECTRICAL CURRENT SWITCHING APPARATUS

Related Applications

This patent application is related to application Ser. Nos. 684,880, 684,882, 685,107, 685,108, and 685,109, all assigned to the present assignee and filed concurrently herewith.

BACKGROUND OF THE INVENTION

This invention relates to an apparatus for sychronously switching electrical circuits, and to a piezoelectric relay which is especially useful in such an apparatus. More particularly, it relates to piezoelectric circuit elements which are specially constructed to switch load current circuits synchronously in time with so-called zero current time points.

Electromagnetic relays have been used in the past to switch a wide range of electrical circuits by separating or closing one or more pairs of electrical contacts. While electromagnetic relays perform satisfactorily for some applications, they can be slow acting, relatively large in size, and costly. They typically require a relatively bulky solenoid coil and associated linkage to provide contact movement. Such coil and linkage systems are, in addition to being a major part of the relay cost, generally energy inefficient. Furthermore, electromagnetic relays do not lend themselves to synchronous operation. Although conventional electromagnetic relays may be employed to switch such loads as, for example, an alternating current electrical circuit on demand, the movement of the contacts is usually random on the time scale of the load current waveform, because of generally long mechanical reaction times associated with the operation of such relays. As a result, opening and closing operations of the contacts are not synchronized with the zero current points of the current waveforms, especially when the load is an alternating current circuit. For electrical circuits operating at current levels typical of such power sources as household electrical wiring, opening and closing of the relay contacts is often accompanied by arcing between the contacts. When the current in such a circuit is interrupted, the current through the relay contacts does not drop to zero at the instant of contact separation, but rather persists in the form of an arc between the contacts, usually until the alternating current waveform approaches the next sinusoidal zero. As the current level decreases toward the sinusoidal zero point, the arc becomes unstable and suddenly is extinguished, a phenomenon often referred to as chopping. This sudden extinction at low current represents an extremely high rate of change of current. As a result, if the electrical circuit in which the current is being interrupted has significant inductance, high voltage transients, proportional to the product of the inductance and the rate of change of the current, are produced. These voltage transients may cause electrical breakdown in either the equipment connected with the circuit, or the relay itself, or both. Moreover, such arcing is damaging to the contacts themselves and can cause contact erosion and contact welding. It is therefore desirable to minimize any arcing occurring between the relay contacts when the contacts are opened or closed. One way to minimize such arcing is to operate the relay so as to switch the electrical circuit at a point in the load current waveform where the current level is as close to zero as possible, which operation is referred to hereinafter as synchronous operation.

A piezoelectric device, utilizing the fast action capability of a piezoelectric bender, is employed in the present invention to provide a synchronously operable switching relay. Synchronous operation requires that the relay contacts be moved between the open and closed positions in a relatively short period of time. The fast action, relatively low mass, and small travel distance of a piezoelectric bender facilitate the use of such a device in a synchronously operable relay. A further characteristic of a piezoelectric device is that the deflecting force acting to move the contacts is at a maximum at the beginning of the piezoelectric bender's deflection. This characteristic further enhances the device's capability of moving the relay contacts in a short period of time. With this fast action capability, a piezoelectric relay may be operated so that the contacts are opened or closed at a time very close to the time when the current level is zero in the circuit being switched, thereby substantially reducing contact erosion, contact welding, and transient inductive voltages. Also, the simplicity of a piezoelectric device avoids most of the mechanical problems of conventional electromagnetic relays, and the energy efficiency of such a device permits operation with far less expenditure of energy.

Piezoelectric benders have been used in the past in a number of applications, including utilization in various piezoelectric relays. For example, piezoelectric benders used as relay elements are described in U.S. Pat. Nos. 2,166,763, 2,182,340, 2,471,967, 2,835,761, 4,093,883, and 4,403,166. However, none of the piezoelectric relays disclosed by these patents have been specifically designed to minimize arcing. No consideration has been given to providing a synchronously operable relay, or to one which is especially useful for switching electrical circuits operating at household power line current levels. As has been noted above, switching circuits operating at such current levels results in significant arcing if the circuit is not switched at a point in time close to a sinusoidal zero of the alternating current level. Application Ser. No. 684,882, assigned to the same assignee as the present invention and filed concurrently herewith, discloses a synchronously operable electrical current switching apparatus which employs a plurality of piezoelectric benders and which may be used to switch multiple circuits or to lower the contact resistance in one or a few circuits. Application Ser. No. 684,880, also assigned to the present assignee and filed concurrently herewith, discloses a synchronously operable electrical current switching apparatus which provides increased separation between the switching contacts when the contacts are in the open position and increased closing force when the contacts are in the closed position. The present invention provides a piezoelectric relay having a very small gap length as compared to the contact separation for conventional relays, which relay may be synchronously operated so that 110 volt alternating current circuits are switched on and off with minimal arcing between the relay contacts.

Furthermore, while the small deflections characteristic of a piezoelectric bender provide a piezoelectric relay with fast action capability, this same feature limits the amount of voltage that may be applied between the relay contacts before electrical breakdown occurs. If the piezoelectric relay possesses relatively small physical dimensions, so as to fit into a 16 pin dual-in-line integrated circuit package (DIP), for example, the separation between the relay contacts is very small, being much smaller than the contact separation for conventional relays designed for operation at household power line current levels. The present inventor has found that even for very short distances between the contacts, the dielectric strength of a piezoelectric device is sufficient for operation with typical 110 volt household power lines. Unexpectedly, sufficient breakdown voltage for such devices can be achieved even for contact separations as small as 0.1 mil. By Paschen's law the breakdown voltage between two electrodes in a gaseous atmosphere is a function of the product of gas pressure and the distance between the electrodes. For an electrode separation of 1 cm. in air at atmospheric pressure, the breakdown voltage can be determined to be approximately 30 kv. If this breakdown field of 30 kv/cm is used to estimate the breakdown voltage of a 1 mil electrode separation in air, as is permissible for separations of a few centimeters, the estimated breakdown voltage is 77 volts. However, it has been found that the breakdown voltage given by Paschen's law does not linearly decrease to zero as the contact separation becomes small, but rather approaches a minimum value and then begins to increase again. For air, this minimum breakdown voltage has been found to be somewhat greater than 300 volts. It is theorized that the reason for this minimum breakdown voltage and subsequent increase in dielectric strength is that, when the product of gas pressure and electrode separation is small, the number of gas atoms with which an electron can collide in traversing the gap between the contacts also becomes small. Since the breakdown process in a gas causes the gas to become an electrical conductor and therefore depends critically upon the ability of electrons in the gap to collide with and ionize ambient gas atoms, the probability of establishing a conducting path is reduced when the number of available target atoms is small. It is believed that the breakdown voltage approaches a minimum and then increases again because the breakdown process undergoes a fundamental change from a gas collision mechanism to an electrode-surface dominated, vacuum-breakdown mechanism, and also because the breakdown voltage of a given contact separation is generally much higher in vacuum than in a gas at atmospheric pressure. Accordingly, the present inventor has determined that a piezoelectric relay having a very small separation between the contacts may be synchronously operated so that 110 volt alternating current circuits are switched on and off with minimal arcing between the relay contacts.

It is seen from the above that it is an object of the present invention to provide a synchronously operable electrical current switching apparatus that functions with minimal arcing between the switch contacts.

It is a further object of the present invention to provide an electrical current switching apparatus which is fast acting, small in size, highly energy efficient, and low in cost.

It is another object of the present invention to provide a rapidly operable piezoelectric relay including a piezoelectric bender which is especially useful in synchronously operating electrical circuits.

It is also an object of the present invention to provide a compact piezoelectric relay which may be enclosed in a 16 pin dual-in-line integrated circuit package.

SUMMARY OF THE INVENTION

In accordance with one embodiment of the present invention, a synchronously operable electrical current switching apparatus comprises a controllable piezoelectric relay having movable electrical contacts and exhibiting conductive and nonconductive states of electrical connectivity between the contacts. The apparatus also includes means for controlling the relay so as to effect a change of state of the electrical connectivity by moving the contacts, and means for operating the controlling means so as to substantially reduce arcing between the contacts. The relay may be switched upon sensing a condition of either substantially zero current through the relay contacts, or substantially zero voltage between the contacts.

In accordance with another embodiment of the present invention, a rapidly operable piezoelectric relay comprises a flat substantially planar piezoelectric bender exhibiting bending motion in response to a controlling electrical signal, and a flexible member disposed adjacent to one of the surfaces of the flat bender which are parallel to the plane in which the bender lies. The flexible member is fixed to the piezoelectric bender so that bending motion of the bender, in a direction substantially perpendicular to the plane in which the bender lies, causes corresponding movement of the flexible member. The flexible member has at least one first electrical contact disposed thereon, and an electrical conductor having at least one second electrical contact is disposed adjacent the flexible member on the side of the member opposite the side thereof which is adjacent to the piezoelectric bender. The relay also includes means for affixing the electrical conductor to the flexible member so that, when the first and second contacts are in an open position, the conductor is electrically isolated from the first electrical contact. This affixing means is also configured so that movement of the flexible member, due to the bending motion of the piezoelectric bender, causes a change in electrical connectivity between the first and second contacts.

BRIEF DESCRIPTION OF THE DRAWINGS

The subject matter which is regarded as the invention is particularly pointed out and distinctly claimed in the concluding portion of the specification. The invention itself, however, both as to its organization and its method of practice, together with further objects and advantages thereof, may best be understood by reference to the following description taken in conjunction with the accompanying drawings, in which:

DETAILED DESCRIPTION OF THE PREFERRED EMBODIMENTS

Figure 1:
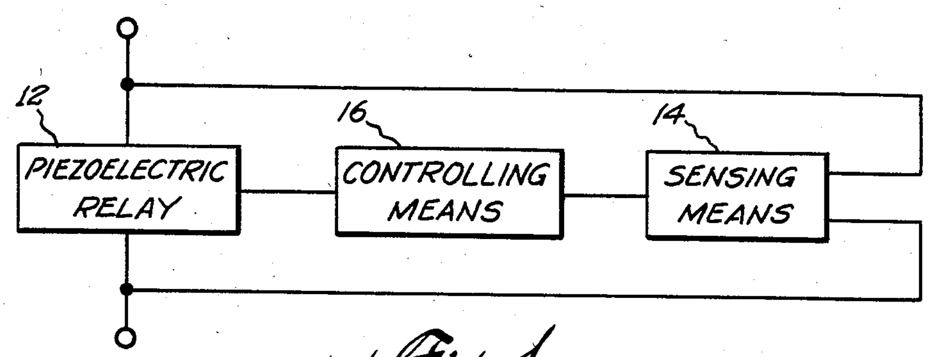
FIG. 1 is a circuit diagram schematically illustrating one embodiment of the present invention.

FIG. 1 is a circuit diagram schematically illustrating one embodiment of the present invention. A synchronously operable electrical current switching apparatus comprises controllable piezoelectric relay 12 electrically connected in a parallel configuration with sensing means 14. Piezoelectric relay 12 has movable electrical contacts, and exhibits electrically conductive and nonconductive states between the contacts, in response to appropriate controlling electrical signals. Controlling means 16 is electrically connected between sensing means 14 and piezoelectric relay 12. Controlling means 16 acts in response to sensing means 14 to provide relay 12 with an appropriate controlling electrical signal to effect a change of state of the electrical connectivity between the contacts of relay 12, through motion of the contacts. Sensing means 14 operates controlling means 16 so that arcing between the contacts of relay 12 is substantially reduced. In one embodiment, sensing means 14 operates to sense a condition of substantially zero current through the contacts of relay 12, with controlling means 16 being responsive to sensing means 14 so that the state of electrical connectivity between the contacts is changed from a conductive state to a nonconductive state when the condition of substantially zero current is sensed. In an alternative embodiment, sensing means 14 operates so as to sense a condition of substantially zero voltage between the contacts of relay 12, with controlling means 16 being responsive to sensing means 14 so that the electrical connectivity between the contacts is changed from a nonconductive state to a conductive state when the condition of substantially zero voltage is sensed. Sensing means 14 and controlling means 16, used to provide synchronous operation of relay 12, may comprise appropriate sensing and controlling means of the type conventionally employed in the electrical current interruption arts. In one embodiment, the sensing and controlling means described in co-pending application Ser. No. 685,107, entitled "Zero Crossing Synchronous AC Switching Circuits Employing Piezoceramic Bender-Type Switching Devices" and assigned to the present assignee, are utilized.

Synchronous operation of a piezoelectric relay in the manner provided by this invention allows the use of such a relay to switch electrical circuits operating at significant current levels, while minimizing arcing between the relay contacts. If the relay contacts are operated so that arcing is minimized, erosion of the contacts and the resulting changes in the gap between the contacts are also minimized. With the change in gap between the contacts being minimized, the relay is operable at very short open-contact gaps, and no significant increase in contact travel distance is required over the operating life of the relay. The short gap between the contacts which may be used in a synchronously operated relay in turn allows the contacts to be opened or closed in a short period of time, using a piezoelectric bender. As an example, and not by way of limitation, contacts having a separation of one mil may be opened or closed in about 200 microseconds. The speed with which such a relay may be operated allows true synchronous operation of such loads as alternating current circuits for which either the current waveform is predictable or the sinusoidal zero current points may be determined.

One particularly useful application of the electrical current switching apparatus of the present invention is for synchronously operating electrical circuits which are connected to conventional 110 volt power lines. For such an application, piezoelectric relay 12 preferably comprises a support structure and a piezoelectric bender affixed to the support structure so that application of an electrical signal to the bender causes deflection of at least a portion of the length of the bender. The relay also includes at least one pair of electrical contacts, with at least one of the contacts being movable so that the contacts exhibit open and closed positions. The contacts are disposed so that the deflection of the bender causes a change between the open and closed positions of the contacts. The contacts are further disposed so that, with the contacts in the open position, the distance therebetween is sufficient that the breakdown voltage between the contacts is greater than about 170 volts. The distance between the contacts is, at the same time, sufficiently small, and the movable contact and associated bender have sufficiently small mass, that the movable contact is movable between the closed and open positions in a time period of less than about 200 microseconds. For one embodiment of the piezoelectric relay of the the present invention, the distance between the relay contacts in the open position is less than about 1 mil, and may be as small as 0.1 mil.

Other particularly useful applications of the switching apparatus of the present invention are for synchronously operating electrical circuits of the type which are typically employed as control circuits for household appliances. Load circuit operating voltages for such applications range from as little as 24 volts to more than 340 volts. The load currents for these circuits include both alternating current and direct current waveforms. When the relay of the present invention is employed to switch direct current electrical loads, operation of the relay may be assisted by such conventional controlling means as, for example, voltage clamping circuitry. Finally, it should be noted that the switching apparatus of the present invention may be operated in air, in vacuum, or in an inert atmosphere, with the choice of operating environment being determined by the particular application involved. It should also be noted that the particularly useful applications for the switching apparatus of the present invention described above are provided by way of example, and are not intended to be limiting.

Figure 2:
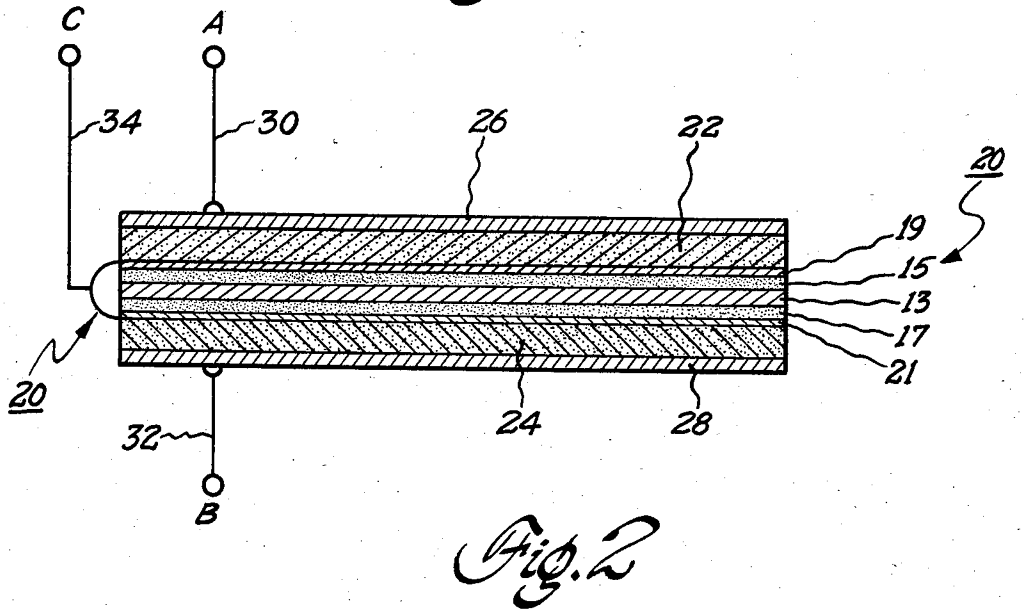
FIG. 2 is a cross-sectional, side elevation view schematically illustrating a typical piezoelectric bender useful in the present invention.

FIG. 2 is a cross-sectional, side elevation view schematically illustrating a typical bilateral piezoelectric bender useful in the present invention. By the term "bilateral", it is meant that the bender is capable of deflection in either of two opposite directions. In the construction shown, central electrically conductive layer 20 is separated from each of outer electrically conductive layers 26 and 28 by piezoelectric material layers 22 and 24. Electrical conductors 30 and 32 are electrically connected to outer layers 26 and 28, respectively, and electrical conductor 34 is electrically connected to central layer 20. The electrically conductive layers and the piezoelectric material layers are arranged so that a flat capacitor, having piezoelectric material as the dielectric, is formed between terminals A and C, and a similar flat capacitor is formed between terminals B and C. When one end of the bender is held fixed and a voltage is applied between terminals A and C, the electric field across piezoelectric material layer 22 causes the free end of the bender to deflect upward. In a similar manner, a voltage applied between terminals B and C causes the free end of the bender to deflect downward. If both ends of the bender are fixed and a voltage is applied either between terminals A and C or between terminals B and C, the center of the bender bows upward or downward, respectively, in an inchworm configuration. In the preferred embodiment of a piezoelectric bender shown in FIG. 2, central electrically conductive layer 20 comprises a 5-layer structure. In this 5-layer structure, spring member 13 provides a central flexible member to facilitate bending motion of the bender. Conductive epoxy layers 15 and 17 serve to fasten the two halves of the bender to central spring member 13. Central conductor layers 19 and 21 electrically connect conductor 34 with piezoelectric material layers 22 and 24.

The simplicity inherent in the type of bender shown in FIG. 2 offers significant advantages over conventional relays which require a wound coil to provide contact motion and which use significant energy for excitation of the coil. The energy required to actuate a piezoelectric bender is very small, being essentially the energy required to charge a relatively small capacitor. For a typical bender of the type shown in FIG. 2, a voltage of between about 100 and 200 volts applied between either terminals A and C or terminals B and C produces a deflection of between about 10 and 20 mils at the free end of the bender, when one end of the bender is held in place. Although a bilateral bender is shown in FIG. 2, it should be noted that monomorph benders, of the type having only two electrically conductive layers separated by a piezoelectric material, may also be used in the present invention.

Figure 3:
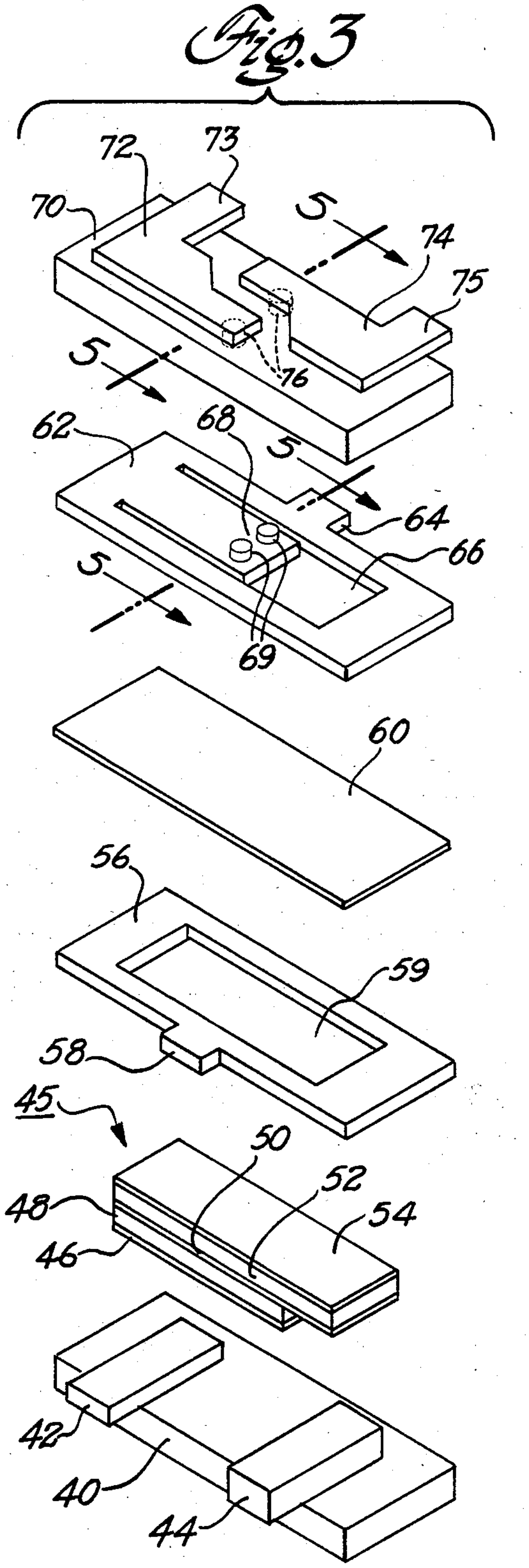
FIG. 3 is an exploded view shown in perspective of one embodiment of a piezoelectric relay according to the present invention.

FIG. 3 is an exploded view shown in perspective of one embodiment of a piezoelectric relay in accordance with the present invention. As shown therein, a piezoelectric relay which is rapidly operable and especially useful in synchronously operating electrical circuits comprises flat, substantially planar piezoelectric bender 45. Piezoelectric bender 45 is of the type having at least two electrically conductive layers separated by a piezoelectric material and exhibiting bending motion in response to a controlling electrical signal, with the bending motion being in a direction substantially perpendicular to the plane in which bender 45 lies. In the embodiment shown in FIG. 3, bender 45 comprises a bilateral bender similar in construction to the bender shown in FIG. 2. Central electrically conductive layer 50 is separated from each of outer electrically conductive layers 46 and 54 by piezoelectric material layers 48 and 52, respectively. Preferably, central electrically conductive layer 50 comprises a 5-layer structure of the type shown in FIG. 2. The relay also comprises flexible member 68 disposed adjacent to one of the surfaces of bender 45 which are parallel to the plane in which bender 45 lies, and means for affixing flexible member 68 to bender 45 so that bending motion of bender 45 causes corresponding movement of flexible member 68. In the embodiment shown in FIG. 3, flexible member 68 is disposed adjacent to bender 45 and affixed thereto by means of flexible member support structure 62 and connecting structure 56. Also, in the embodiment shown, optional flexible insulative sheet 60 is disposed between flexible member 68 and connecting structure 56, so as to electrically isolate flexible member 68 from bender 45. Flexible member support structure 62 and insulative sheet 60 are attached to one side of connecting structure 56, and bender 45 is attached to the other side thereof. Connecting structure 56 includes aperture 59 therein, with aperture 59 being configured and located so that, as a result of bending motion of bender 45 in a direction substantially perpendicular to the plane in which bender 45 lies, a portion of bender 45 protrudes into aperture 59 and causes corresponding movement of flexible sheet 60 and flexible member 68. In the embodiment shown, aperture 59 is wider than bender 45 and connecting structure 56 is affixed to bender 45 at both ends thereof, with the middle portion of bender 45 being free to move through aperture 59, in an inchworm configuration, to provide bending motion and corresponding movement of insulative sheet 60 and flexible member 68. In an alternative embodiment to that shown in FIG. 3, connecting structure 56 is affixed to bender 45 at one end thereof, with the opposite end of bender 45 being free to move through aperture 59 to provide similar bending motion. This alternative embodiment may be used to provide greater bender movement for a bender of given length, or to provide the same amount of bender movement as the inchworm configuration, for a bender of shorter length.

Flexible member 68 has at least one first electrical contact 69 disposed thereon. At least one electrical conductor, including at least one second electrical contact 76, is disposed adjacent to flexible member 68 and located on the side thereof opposite the side which is adjacent to insulative sheet 60 and piezoelectric bender 45. In the embodiment shown in FIG. 3, two such electrical conductors, 72 and 74, are employed. Electrical conductors 72 and 74 are disposed with respect to flexible member 68 so that movement of member 68, due to bending motion of piezoelectric bender 45, causes a change in electrical connectivity between first and second contacts 69 and 76, respectively, by changing the relative position of contacts 69 and 76 between open and closed positions. Electrical conductors 72 and 74 are further disposed with respect to flexible member 68 so that, when first and second electrical contacts 69 and 76, respectively, are in an open position, conductors 72 and 74 are electrically isolated from first electrical contact 69. In the embodiment illustrated, electrical conductors 72 and 74 are affixed to flexible member 68 by means of insulative strip 70 disposed between each of conductors 72 and 74 and flexible member support structure 62. One end of member 68 is attached to support structure 62 and the other end of member 68 is disposed in aperture 66, which extends through the thickness of support structure 62, so that flexible member 68 is movable in a direction substantially perpendicular to the plane in which support structure 62 lies. In one embodiment, support structure 62 and member 68 comprise an integral structure. At least one first electrical contact 69 is disposed on flexible member 68 at a point spaced apart from the point at which member 68 is attached to support structure 62.

Figure 5:
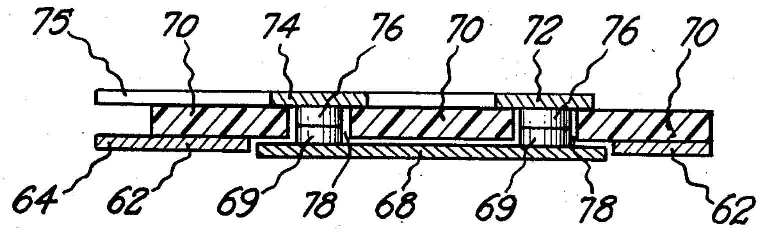
FIG. 5 is a cross-sectional view of the apparatus shown in FIG. 3, taken along line 5—5.
Figure 4:
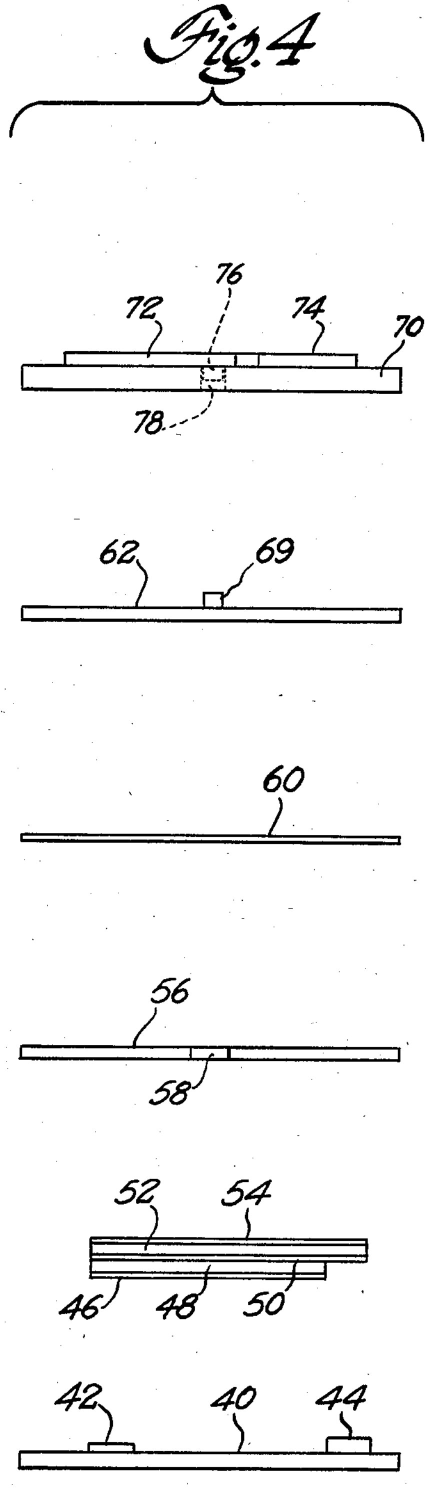
FIG. 4 is an exploded view shown in side elevation of the relay shown in FIG. 3.

As better illustrated by FIG. 4, which is an exploded view shown in side elevation of the relay shown in FIG. 3, insulative strip 70 contains at least one aperture 78, with aperture 78 extending through the thickness of insulative strip 70. As shown in the cross-sectional view of FIG. 5, taken along line 5—5 of the apparatus shown in FIG. 3 and illustrating the apparatus as it would appear in assembled form rather than in an exploded view, each aperture 78 is disposed in proximity to a pair of first and second electrical contacts 69 and 76, respectively. Each aperture 78 is aligned with contacts 69 and 76 so that movement of flexible member 68 having first electrical contact 69 disposed thereon, caused by bending motion of piezoelectric bender 45, causes a change in the relative position of each pair of contacts 69 and 76 between open and closed positions. As shown in FIG. 5, flexible member 68 is preferably disposed with respect to insulative strip 70 so that there is a small separation between strip 70 and member 68 when contacts 69 and 76 are in the closed position. This separation allows the deflection force available from bender 45 to be applied as a closing force between contacts 69 and 76, and also allows contact 69 to move a sufficient amount to close the contacts even if some erosion of contacts 69 and 76 occurs.

Preferably, at least two apertures such as apertures 78 are provided, with each aperture 78 having a pair of first and second electrical contacts 69 and 76 disposed therein in the manner illustrated in FIG. 5. In this preferred embodiment, apertures 78 and contacts 69 and 76 are all cylindrically shaped. Contacts 69 and 76 are further disposed so that, when they are in the open position, at least the mating surface of each contact is circumferentially enclosed by the surface of insulative strip 70 which defines aperture 78. The diameter of each of contacts 69 and 76 is slightly smaller than the diameter of aperture 78. This configuration has the advantage that, when a voltage is applied between contacts 69 and 76, the fringe component of the electric field between the contacts is interrupted by an electrical insulator, effectively shortening the fringing electric field lines. Most of the fringing field lines will terminate on the surface of insulative strip 70 which defines aperture 78, rather than on the opposite contact. The present inventor has found that, because the breakdown voltage is related to the length of the electric field lines, under certain conditions, interrupting the fringe component of the electric field in this manner increases the breakdown voltage between the contacts.

A further advantage of employing two sets of first and second electrical contacts 69 and 76 is that contacts 69 may be electrically connected to form a bridging contact which, when in the closed position, electrically connects contacts 76 to each other, so that the relay is operable in a single-pole single-throw configuration. Employing a bridging contact essentially results in two gaps in series between the switch contacts. The breakdown voltage for a switch having two gaps in series between the switch contacts is approximately twice the breakdown voltage for a similar switch having only one gap (of the same length) between the contacts. Thus, for a given travel distance between first and second electrical contacts 69 and 76, the breakdown voltage may be increased by employing the embodiment of FIG. 5 and electrically connecting contacts 69. Furthermore, for applications requiring even greater breakdown voltage than that available from using only one bridging contact, a plurality of such bridging contacts may be employed, electrically connected together in series. Alternatively, for applications where the breakdown voltage between contacts 69 and 76 is sufficient without utilizing a bridging contact arrangement, each of contacts 69 and 76 may be electrically connected to separate electrical conductors, so that the relay is operable in a double-pole single-throw configuration.

In one embodiment of the present invention, the bending motion of piezoelectric bender 45 is in a direction toward insulative strip 70, so that the bending motion causes a change in relative position between first and second contacts 69 and 76 from the open position to the closed position. In an alternative embodiment, the bending motion of bender 45 is in a direction away from insulative strip 70, so that the bending motion causes a change in relative position between first and second contacts 69 and 76 from the closed position to the open position. For either of these embodiments, it is not necessary that bender 45 comprise a bilateral piezoelectric bender, as shown in FIG. 3. A monomorph bender, even one which exhibits bending motion in only one direction, may also be used to provide the required bending motion. However, for applications where there is significant heat buildup in the bender, a bilateral bender is preferred. The symmetrical construction of a bilateral bender, which has a central electrically conductive layer and two outer electrically conductive layers, with the central layer separated from each of the outer layers by a piezoelectric material, is thermally more stable and less likely to undergo significant distortion through differential thermal expansion. Also, since a bilateral bender exhibits bending motion in a direction toward flexible member 68 in response to an appropriate first controlling electrical signal, and bending motion away from member 68 in response to an appropriate second controlling signal, a relay employing a bilateral piezoelectric bender is operable as either normally open or normally closed, or both. Furthermore, the bilateral capability of bending in opposite directions may be employed to provide a larger separation between the switching contacts when they are in the open position, than would be achievable for a given controlling signal using a monomorph bender. Additionally, if a second assembly of the elements shown as being located above bender 45 in FIG. 3 is provided, with the second assembly being located below bender 45 and disposed symmetrically with respect to the elements located above bender 45, the relay is operable in either a double-pole single-throw configuration or a double-pole double throw configuration.

For applications where it is desirable, flexible member support structure 62 and flexible member 68 may comprise electrically conductive material, so that they provide a means for electrically connecting first electrical contacts 69 with an external electrical conductor. For such applications, flexible member connector tab 64 is used to electrically connect contacts 69 with the external conductor. In a similar manner, connecting structure 56 may comprise electrically conductive material, so that connecting structure 56 provides a means for electrically connecting electrically conductive layer 54 of piezoelectric bender 45 with a controlling electrical signal, by means of connecting structure tab 58. Electrical conductor tabs 73 and 75 are used to electrically connect conductors 72 and 74 to external circuitry.

In the embodiment shown in FIG. 3, the piezoelectric relay further comprises mounting substrate 40 disposed adjacent the side of bender 45 opposite the side thereof which is attached to connecting structure 56. Mounting structure 40 includes first and second substrate electrical conductors 42 and 44 disposed thereon. As illustrated in FIG. 4, substrate conductors 42 and 44 are configured and located so that first substrate conductor 42 is electrically connected to outer electrically conductive layer 46 of bender 45, and so that second substrate conductor 44 is electrically connected to central electrically conductive layer 50. In this manner, substrate conductors 42 and 44 provide a means for applying electrical signals to conductive layers 46 and 50 of bender 45.

For all the embodiments discussed above, mounting structure 40, bender 45, connecting structure 56, insulative sheet 60, flexible member support structure 62, insulative strip 70, and conductors 72 and 74 may be fastened to each other, respectively, by any conventional fastening means, such as, for example, adhesive bonding. The materials used to fabricate the various elements of the relay shown in FIGS. 3-5 may be chosen from a variety of electrically conductive and nonconductive materials, in order to meet the needs of particular applications. Preferably, mounting substrate 40, connecting structure 56, insulative sheet 60, flexible member support structure 62, and insulative strip 70 each comprise a flat structure. Furthermore, the piezoelectric relay shown in FIGS. 3-5 may be designed to have dimensions which fit in a conventional 16 pin dual-in-line plastic package, of the type used to enclose integrated circuits. The present inventor has determined that, although the open-contact separation between the contacts of a relay designed to fit in such a package is much smaller than conventional relays used for operating 110 volt alternating current circuits, a piezoelectric relay in accordance with the present invention is capable of functioning at such small contact separations. As an example, and not by way of limitation, the relay illustrated in FIG. 3 may be constructed so that bender 45 is 600 mils long and 150 mils wide, and so that all of the elements of the relay have a length and width less than 800 mils and 250 mils, respectively. Mounting substrate 40 having conductors 42 and 44 disposed thereon may comprise a 0.025 inch layer of ceramic upon which are disposed copper layers of 0.010 inches and 0.020 inches, respectively. Layer 50 of bender 45 may comprise a brass foil of 0.002 inches in thickness, layers 48 and 52 may comprise piezoelectric material of 0.010 inches in thickness, and outer layers 46 and 54 may comprise thin metal films. Connecting structure 56 may comprise a copper mask of 0.010 inches in thickness, and insulative sheet 60 may comprise a flexible insulative material of 0.003 inches in thickness. Flexible member support structure 62 may be made from a 0.010 inch phosphor bronze leaf. Insulative strip 70 having conductors 72 and 74 disposed thereon may comprise a 0.025 inch layer of ceramic upon which are disposed copper layers of 0.010 inches in thickness. The entire assembly thus consists of a piezoelectric bender accessible through three terminals on one side of the assembly and a relay contact system accessible by three terminals on the other side of the assembly.

The foregoing describes a synchronously operable electrical current switching apparatus that functions with minimal arcing between the switch contacts and which is fast acting, small in size, highly energy efficient, and low in cost. The present invention further provides a rapidly operable piezoelectric relay which utilizes a piezoelectric bender and is useful for switching electrical circuits which function at household power line current levels. The instant invention also provides a compact piezoelectric relay which may be enclosed in a 16 pin dual-in-line integrated circuit package.

While the invention has been described in detail herein in accord with certain preferred embodiments thereof, many modifications and changes therein may be effected by those skilled in the art. For example, while contacts 69 and 76 have been shown as cylindrically shaped, other shapes may also be used. Accordingly, it is intended by the appended claims to cover all such modifications and changes as fall within the true spirit and scope of the invention.

The invention claimed is:

1. A synchronously operable electrical current switching apparatus for switching an electrical load, said apparatus comprising:

a controllable piezoelectric relay having movable electrical contacts and exhibiting conductive and nonconductive states of electrical connectivity between said contacts, said relay including a support structure, a piezoelectric bender affixed to said support structure so that application of an electrical signal to said bender causes deflection of at least a portion of the length of said bender, at least one pair of said movable electrical contacts, with at least one of said contacts being movable so that said contacts exhibit open and closed positions corresponding to said nonconductive and conductive states of electrical connectivity, respectively, said contacts being disposed so that said deflection of said bender causes a change between said open and closed positions of said contacts, said contacts being further disposed so that, with said contacts in said open position, the distance therebetween is sufficient that the breakdown voltage between said contacts is greater than the maximum operating voltage of the load being switched by said switching apparatus, with said distance also being sufficiently small, and with said movable contact and associated bender having sufficiently small mass, that said movable contact is movable between said closed and open positions in a time period sufficiently small that said state of electrical connectivity is changeable while the load current through said contacts is substantially zero;

means for controlling said relay so as to effect a change of state of said electrical connectivity, through motion of said contacts, by selectively applying said electrical signal to said bender; and means for operating said controlling means so as to substantially reduce arcing between said contacts.

2. The apparatus of claim 1 wherein said means for operating said controlling means comprises means for sensing a condition of substantially zero current through said relay contacts, said controlling means being responsive to said sensing means so as to cause a change of said state of electrical connectivity between said contacts, from a conductive state to a nonconductive state, upon said condition of substantially zero current.

3. The apparatus of claim 1 wherein said means for operating said controlling means comprises means for sensing a condition of substantially zero voltage between said relay contacts, said controlling means being responsive to said sensing means so as to cause a change of said state of electrical connectivity between said contacts, from a nonconductive state to a conductive state, upon said condition of substantially zero voltage.

4. The apparatus of claim 1 wherein said maximum operating voltage is about 170 volts, and wherein said time period is less than about 200 microseconds.

5. The apparatus of claim 4 wherein said distance between said contacts in the open position is less than about 1 mil.

6. The apparatus of claim 1 wherein said maximum operating voltage is about 340 volts, and wherein said time period is less than about 200 microseconds.

7. The apparatus of claim 1 wherein said maximum operating voltage is about 24 volts.

8. The apparatus of claim 7 wherein said time period is less than about 200 microseconds.

9. A rapidly operable piezoelectric relay especially useful in a synchronously operable electrical current switching apparatus, said piezoelectric relay comprising:

a flat substantially planar piezoelectric bender of the type having at least two electrically conductive layers separated by a piezoelectric material and exhibiting bending motion in response to a controlling electrical signal, said motion being in a direction substantially perpendicular to the plane in which said bender lies;

a flexible member disposed adjacent to one of the surfaces of said flat bender which are parallel to the plane in which said bender lies, said member including at least one first electrical contact disposed thereon;

means for affixing said flexible member to said piezoelectric bender so that said bending motion of said bender causes corresponding movement of said flexible member;

an electrical conductor disposed adjacent to said flexible member and located on the side of said member opposite the side thereof which is adjacent to said piezoelectric bender, said electrical conductor including at least one second electrical contact;

an insulative strip having at least one aperture therein, said strip being disposed between said flexible member and said electrical conductor; and means for fixing said insulative strip to said flexible member at a point spaced apart from the point at which said at least one first electrical contact is disposed on said flexible member so that said aperture is disposed in proximity to said first and second electrical contacts and aligned therewith such that said bending motion of said piezoelectric bender causes a change in the relative position of said contacts between open and closed positions.

10. The relay of claim 9 wherein at least two each of said first and said second electrical contacts and said apertures in said insulative strip are provided, with said contacts and said apertures being cylindrically shaped, and with said contacts being disposed in said apertures so that, when said first and second contacts are in the open position and voltage is applied therebetween, the fringing component of the electric field lines between said first and second contacts are interrupted by said insulative strip.

11. The relay of claim 9 wherein said bending motion of said piezoelectric bender is in a direction toward said insulative strip, so that said motion causes a change in relative position between said first and second contacts from the open position to the closed position.

12. The relay of claim 9 wherein said bending motion of said piezoelectric bender is in a direction away from said insulative strip, so that said motion causes a change in relative position between said first and second contacts from the closed position to the open position.

13. The relay of claim 9 wherein at least two of said first electrical contacts and at least two of said second electrical contacts are provided, with said first electrical contacts being electrically connected to each other, and said second contacts having electrical conductors electrically connected thereto, so that said relay is operable in a single-pole single-throw configuration.

14. The relay of claim 9 wherein at least two of said first electrical contacts and at least two of said second electrical contacts are provided, with each of said contacts having electrical conductors electrically connected thereto so that said relay is operable in a double-pole single-throw configuration.

15. The relay of claim 9 wherein said means for affixing said flexible member to said piezoelectric bender comprises:

a connecting structure disposed between said flexible member and said piezoelectric bender, with said flexible member attached to one side of said connecting structure and said piezoelectric bender attached to the other side thereof; and an aperture in said connecting structure, said aperture being configured and located so that, as a result of the motion of said bender, a portion of said bender protrudes into said aperture and causes said corresponding movement of said flexible member.

16. The relay of claim 15 wherein said connecting structure comprises electrically conductive material, so that said structure provides a means for electrically connecting the adjacent electrically conductive layer of said piezoelectric bender with a controlling electrical signal.

17. The relay of claim 15 wherein said connecting structure is fixed to said piezoelectric bender at one end thereof, with the opposite end of said bender being free to move through said aperture in said connecting structure, so as to provide said bending motion in said direction substantially perpendicular to the plane in which said bender lies.

18. The relay of claim 15 wherein said connecting structure is fixed to said piezoelectric bender at both ends thereof, with the middle portion of said bender being free to move through said aperture in said connecting structure, so as to provide said bending motion in said direction substantially perpendicular to the plane in which said bender lies.

19. The relay of claim 9 further comprising a flexible insulative sheet disposed between said flexible member and said piezoelectric bender, so as to electrically isolate said flexible member from said bender.

20. The relay of claim 19 wherein said flexible member comprises an electrically conductive material, so that said member provides a means for electrically connecting said at least one first contact with an external electrical conductor.

21. The relay of claim 9 wherein said piezoelectric bender comprises a bilateral piezoelectric bender exhibiting bending motion in a direction toward said flexible member in response to a first controlling electrical signal, and bending motion away from said flexible member in response to a second controlling electrical signal.

22. The relay of claim 16 wherein said piezoelectric bender comprises a bilateral piezoelectric bender of the type having a central electrically conductive layer and two outer electrically conductive layers, with said central layer separated from each of said outer layers by a piezoelectric material, said relay further comprising a flexible insulative sheet disposed between said flexible member and said piezoelectric bender, so as to electrically isolate said flexible member from said piezoelectric bender.

23. The relay of claim 22 further comprising a mounting substrate disposed adjacent the side of said piezoelectric bender opposite the side thereof which is attached to said connecting structure, said mounting structure including first and second substrate electrical conductors disposed thereon, said substrate conductors being configured and located so that said first substrate electrical conductor is electrically connected to the outer electrically conductive layer of said bilateral piezoelectric bender opposite the outer electrically conductive layer thereof which is adjacent to said connecting structure, and so that said second substrate electrical conductor is electrically connected to the central electrically conductive layer of said bilateral piezoelectric bender.

24. The relay of claim 23 wherein said flexible member, said insulative strip, said connecting structure, said mounting substrate, and all of said electrical conductors each comprise a flat structure.

25. The relay of claim 21 wherein a second assembly of said flexible member, said means for affixing said flexible member to said piezoelectric bender, said electrical conductor disposed adjacent said flexible member, and said insulative strip is provided, said second assembly being symmetrically located and disposed on the side of said bilateral piezoelectric bender opposite the side thereof where the first assembly of said elements is located.

* * * * *